United States Patent
Bodas

(10) Patent No.: US 6,686,666 B2
(45) Date of Patent: Feb. 3, 2004

(54) BREAKING OUT SIGNALS FROM AN INTEGRATED CIRCUIT FOOTPRINT

(75) Inventor: Devadatta V. Bodas, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/147,800

(22) Filed: May 16, 2002

(65) Prior Publication Data

US 2003/0214030 A1 Nov. 20, 2003

(51) Int. Cl.⁷ .............................................. H01L 29/40
(52) U.S. Cl. .................. 257/786; 438/125; 438/129; 438/106; 257/693; 257/700
(58) Field of Search ................... 438/106, 125, 438/129, 599, 614, 622; 361/780; 257/690, 692, 698, 700, 736, 778, 693, 786

(56) References Cited

U.S. PATENT DOCUMENTS 5,847,936 A    12/1998   Forehand et al.
6,194,668 B1   2/2001    Horiuchi et al.
6,215,184 B1   4/2001    Ooto et al.
6,388,890 B1 * 5/2002    Kwong et al. .............. 361/780

* cited by examiner

Primary Examiner—Caridad Everhart
(74) Attorney, Agent, or Firm—Blakely, Sokoloff, Taylor & Zafman LLP

(57) ABSTRACT

Pads are arranged as an integrated circuit (IC) footprint, and are formed in a stackup that includes an insulating layer and multiple signal routing layers. The footprint has a polygonal shape. There is an inner pad region, a middle pad region that surrounds the inner pad region, and an outer pad region that surrounds the middle pad region. Some of the pads of each pad region are connected to a respective group of signal lines. Some of the signals that are connected to pads of the outer region which are located in a corner of the polygonal shape are routed out of the footprint in a different layer than the one used to route signal lines that are connected to pads of the outer region which are located between two adjacent corners of the polygonal shape.

37 Claims, 7 Drawing Sheets

BREAKING OUT SIGNALS FROM AN INTEGRATED CIRCUIT FOOTPRINT

BACKGROUND

An embodiment of the invention relates to printed circuit board layout techniques.

A printed wiring board, also referred to as a printed circuit board, is a structure that communicatively interconnects a number packaged integrated circuits (i.e., ICs), as part of an electronic system. For example, every notebook and desktop personal computer has a motherboard on which processor, system chipset, and main memory IC packages are installed. Each package is electrically connected to a separate group of conductive pads that are formed on a surface of the board. These pads may be referred as having a 'footprint' of that package. The pad to package connection may be made by, for instance, direct soldering the package to the pads, or mounting the package on a socket that itself is soldered to the pads.

The board has conductive signal lines formed in one or more signal routing layers. A signal line is typically routed between, and electrically connects, a pad for one package and one or more corresponding pads for another package. The process of determining or creating a route for a signal line to go from a pad within a footprint to a location outside of the footprint, without being too close or touching other pads or signal lines, is called 'breaking out the signal'.

To support complex logic functions, an IC package uses a large number of signals and hence requires a correspondingly large number of pads in its footprint. If the signals that are to be broken out of a footprint are too numerous to fit on a single routing layer of a board, then additional routing layers must be provided in the board to break out all of the remaining signals. Each additional layer, however, may substantially increase the cost of manufacturing the board.

BRIEF DESCRIPTION OF THE DRAWINGS

The invention is illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

According to an embodiment of the invention, an article of manufacture, such as a printed wiring board having two or more signal routing layers with at least one insulating layer there between, is designed so as to allow signals from an inner pad region of an IC footprint to be broken out without requiring an additional routing layer.

Figure 1:
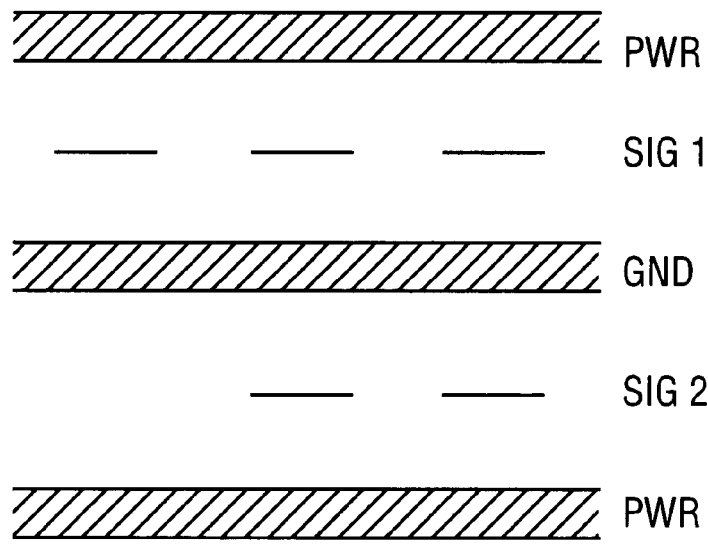
FIG. 1 shows a cross section of a stackup having two signal routing layers.
Figure 2:
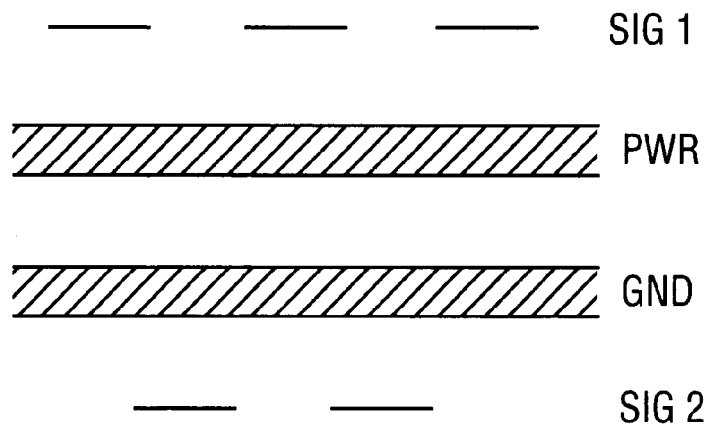
FIG. 2 shows another stackup having two signal routing layers.
Figure 3:
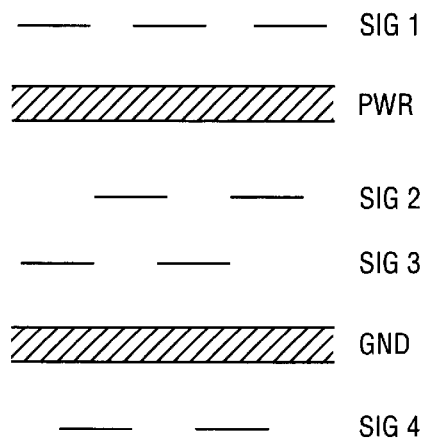
FIG. 3 shows a stackup with four signal routing layers.
Figure 4:
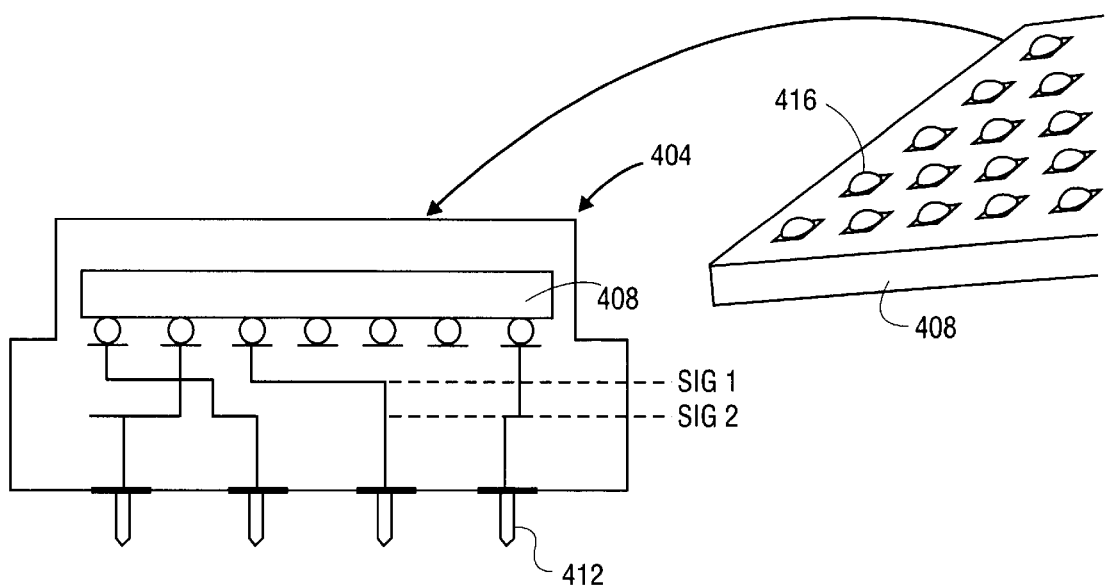
FIG. 4 depicts a flip chip integrated circuit package having two signal routing layers.

The pads are arranged as an IC footprint, and are formed in a stackup that includes the insulating layer and multiple signal routing layers. Several possible stackups are described here. For example, as shown in FIG. 1, there may be two signal routing layers separated by at least two insulating layers. In addition, three reference planes, in this example two power planes and a ground plane, may also be provided. In FIG. 2, there are also two signal routing layers, with one power plane and one ground plane. Note how in FIG. 2, the signal routing layers are the topmost and bottommost metal layers of the stackup. Referring now to FIG. 3, that stackup has four signal routing layers, with one power plane and one ground plane. Each of the three stackups shown in FIGS. 1–3 is an example of a balanced stackup, that is one which is essentially physically symmetrical on either side of a center plane through the stackup. Although non-balanced stackups could also benefit from an embodiment of the invention, it is expected that balanced stackups provide better reliability, particularly when used as part of a relatively large printed wiring board. In applications other than printed wiring boards, however, unbalanced stackups may be used. For example, FIG. 4 shows a flip chip integrated circuit package 404 in which there are two signal routing layers that electrically connect the pads of an IC footprint for an IC die 408 with corresponding pins 412 of the IC package. The signal routing layers are formed in a packaging substrate or an interposer. In this embodiment of the invention, the IC die 408 has solder balls 416 that electrically interconnect the die 408 to the pads of the footprint.

The various embodiments of the invention may provide an advantageous effect, in terms of a reduction in the number of signal routing layers, for stackups that have an even number of signal routing layers. However, the techniques for breaking out the signals described below are also applicable to a subset of a stackup in which there are a total, odd number of signal layers (in those cases, three or more signal layers).

Figure 5:
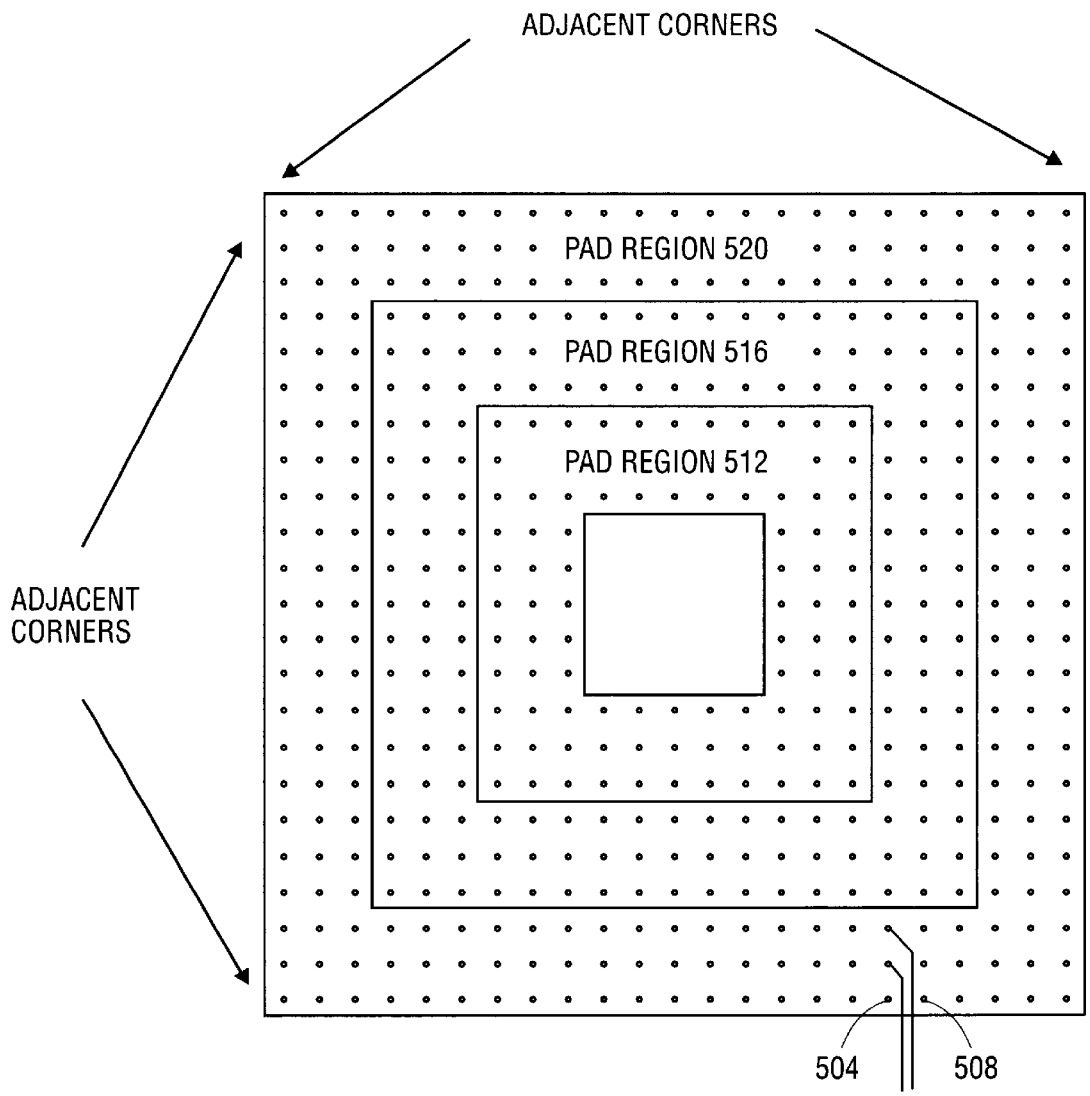
FIG. 5 shows an integrated circuit footprint with outer, middle, and inner pad regions.

Turning now to FIG. 5, this figure shows a square IC footprint in which the pads (represented by dots) are arranged in a grid pattern. For modern IC package applications, the average spacing between adjacent pads of the footprint, in a vertical or horizontal direction, is 1.3 mm or less. In general, however, the techniques for breaking out the signals as described below are still applicable to IC footprints having a different average spacing. Also, the techniques may be applied, more generally, to other footprint shapes including a footprint having a polygonal shape with multiple corners, a special case of which is the rectangle. In addition, the arrangement of the pads in the IC footprint need not be strictly a grid pattern, but instead may have a skewed pattern such as that shown in FIG. 7.

Figure 6:
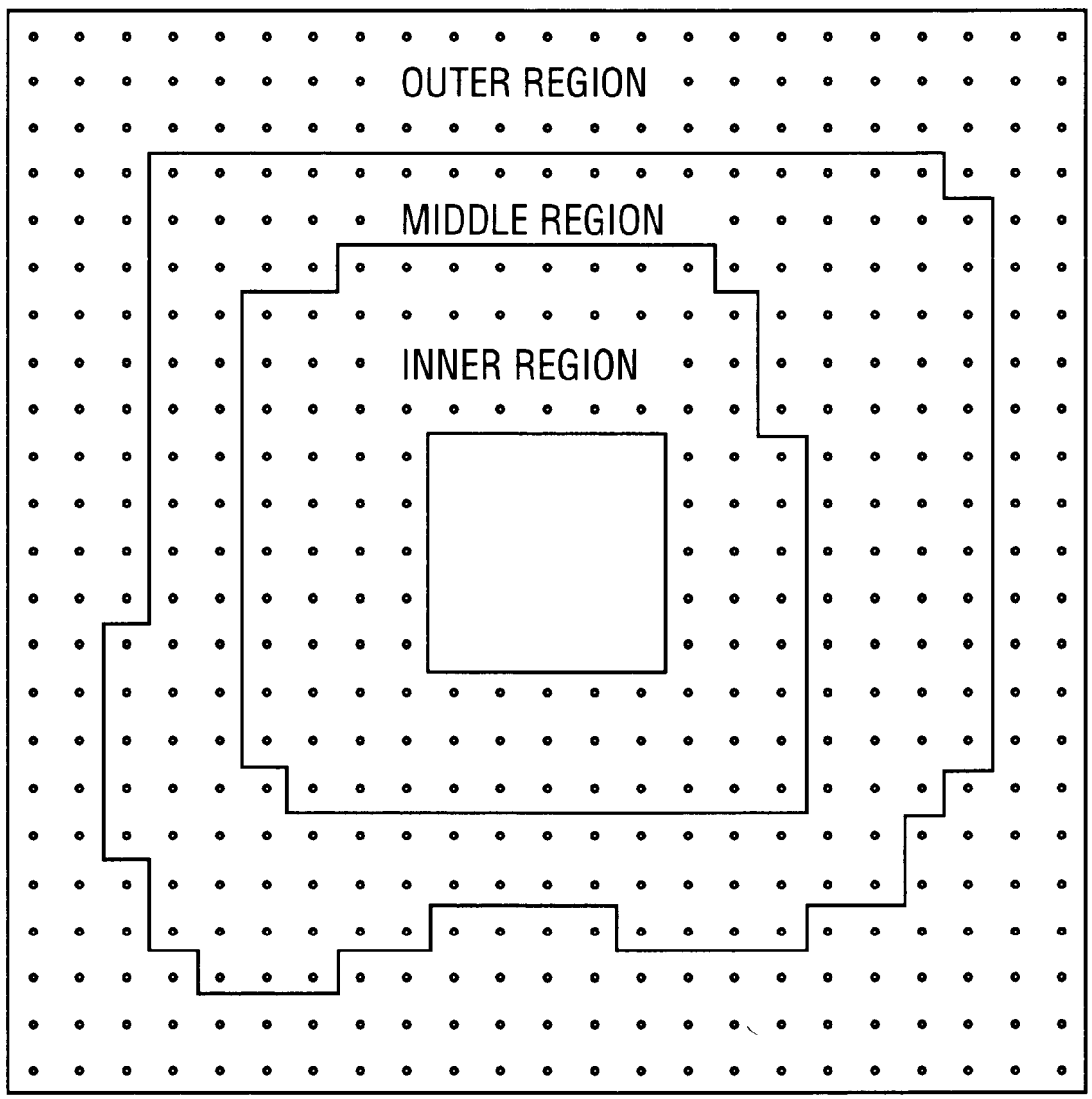
FIG. 6 illustrates another integrated circuit footprint with outer, middle, and inner pad regions.
Figure 7:
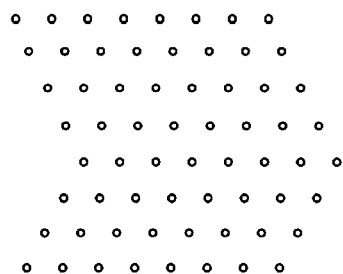
FIG. 7 depicts an integrated circuit footprint that is not a square shape.

Some of the embodiments of the invention described below in connection with FIGS. 5–7 involve a system in which the signal lines are sized and arranged such that no more than two signal lines are allowed to be routed in the same routing layer between adjacent pads. This is depicted in FIG. 5 where a pair of signal lines are routed between pads 504 and 508. However, the techniques of breaking out the signals as described herein are also applicable to systems which allow more than two signals to be routed in the same layer, between adjacent pads. A factor that strongly affects the number of signal lines that can be routed in the same routing layer between adjacent pads is the minimum width of the signal line (where wider signal lines may exhibit less resistance and inductance and are thus more suitable for high frequency applications).

Still referring to FIG. 5, the IC footprint in this example has a rectangular shape, in particular a square shape, with four corners. Note the adjacent corners as indicated. There are, in this example, a total of three pad regions. There is an inner pad region 512, a middle pad region 516 that surrounds the inner pad region 512, and an outer pad region 520 that surrounds the middle pad region 516. The demarcation of the pad regions 512–520 as squares is not necessary. The pad regions may be delineated by other shapes, such as the irregular shapes shown in FIG. 6. These pads are formed in a metal layer that is part of the stackup. This metal layer in which the pads of the IC footprint are formed may be separate from the signal routing layers SIG 1 and SIG 2 (see FIG. 1). Thus, for example, in FIG. 1, the metal layer that contains the pads of the IC footprint may be the same as the topmost power layer PWR. Alternatively, the metal layer in which the pads are formed may be the same as the topmost signal routing layer SIG 1 as seen in FIG. 2.

Figure 8:
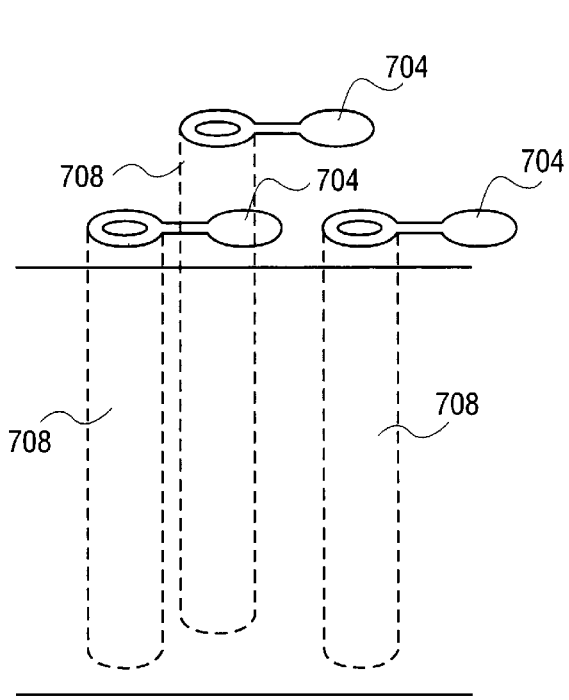
FIG. 8 shows a plan view of part of a stackup in which surface mount pads are formed.
Figure 9:
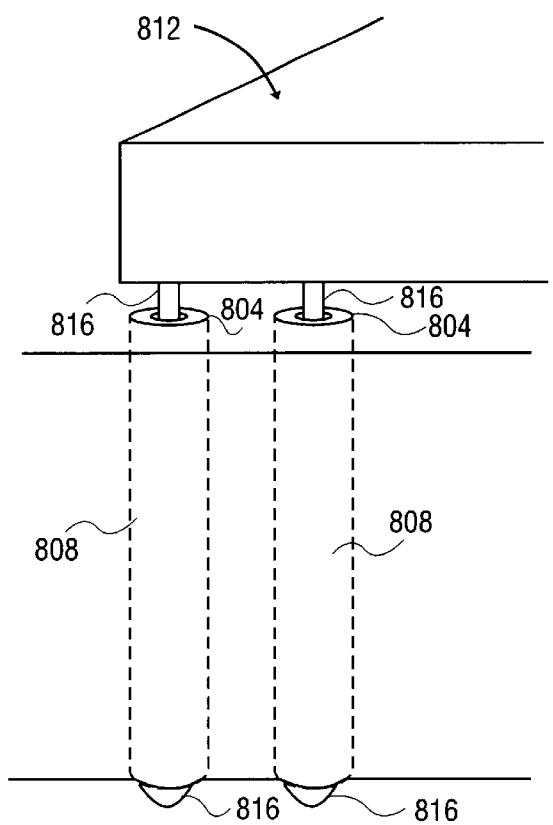
FIG. 9 shows a plan view of part of a stackup in which through-hole pads are formed.

The pads of the IC footprint may be suitable for surface mount or through hole installation of an IC package. For example, in FIG. 8, three surface mount pads 704 are shown, on the topmost metal layer of a printed wiring board. In such a configuration, each surface mount pad 704 has an associated via 708 adjacent thereto that drops down into the board to electrically connect with other metal layers of the board (not shown). This is an example of a type of footprint that is suitable for soldering a ball grid array IC package to the pads 704. In contrast, the pair of through hole pads 804 shown in FIG. 8 are positioned directly above their respective through hole vias 808. In that configuration, a through hole IC package 812 has been soldered to the board at each one of a number of pins 816 that are passed through their respective through hole vias 808. The configuration of FIG. 8 is suitable for installing a pin grid array IC package. Another alternative may be to have surface mount pads formed directly above their respective vias 708 (not shown). Although the pads are shown as being round (circular or elliptical), an alternative could be a square or other shape suitable for the manufacturing process.

Figure 10:
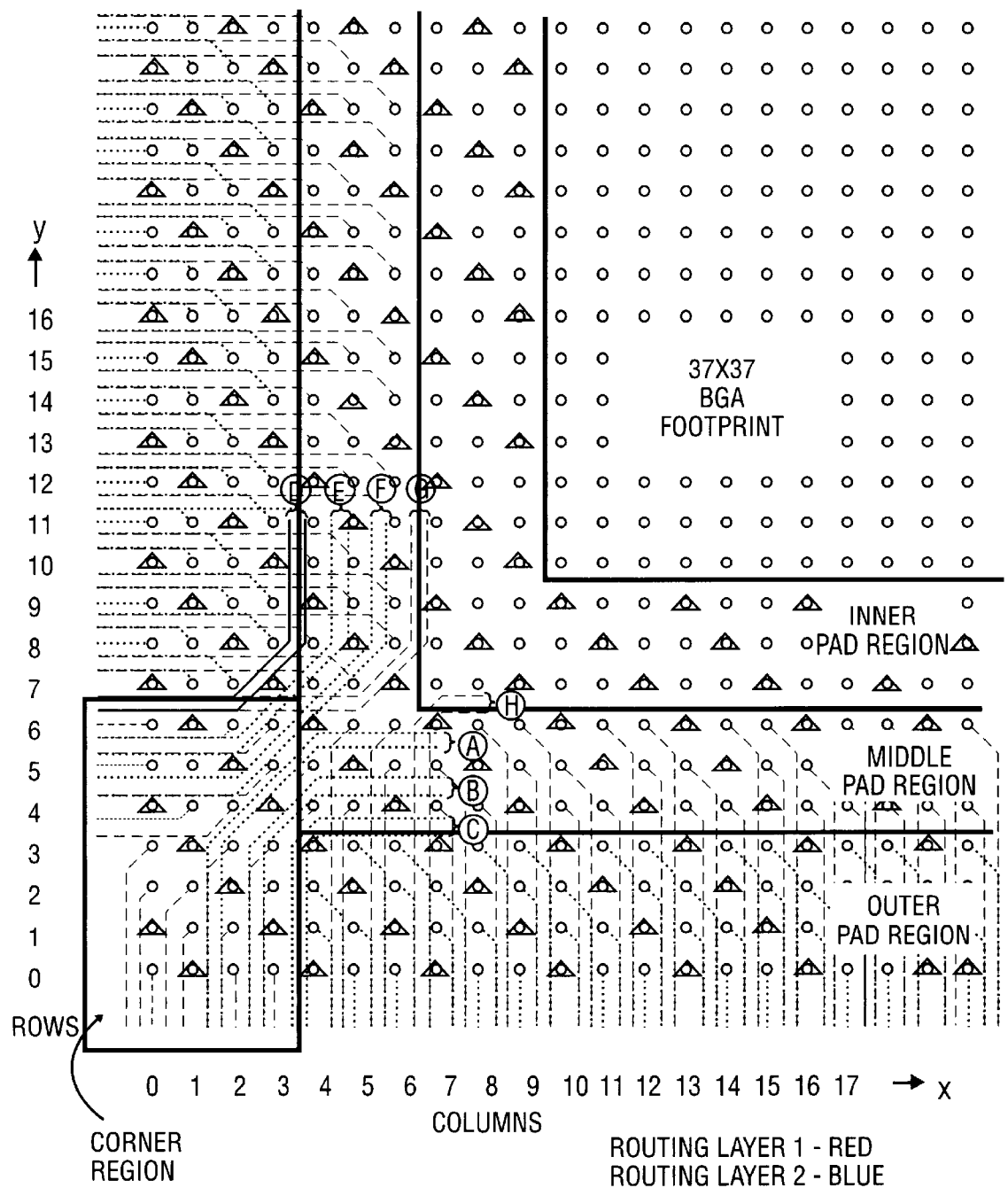
FIG. 10 illustrates a close up view of a corner of an integrated circuit footprint, showing how signal lines are broken out in an angled fashion from an inner pad region.

Turning now to FIG. 10, what is shown there is a closeup of how signal lines are routed near a corner of an IC footprint, according to an embodiment of the invention. For purposes of explanation only, let the outer pad region be defined by a ring being four pads wide. Similarly, let the middle pad region be a ring that is three pads wide as shown. The inner pad region is also three pads wide in this example. Also, there are two routing layers, a first one indicated by the color red, and a second one indicated by the color blue. The figure shows that some of the pads of each pad region are connected to a separate group of signal lines that are formed in the signal routing layers of the stackup. Note how the signal lines that are connected to pads of the outer region which are located in a corner of the IC footprint are routed out of the footprint in a different signal routing layer than the one used to route signal lines that are connected to the pads of the outer region which are located between two adjacent corners of the footprint. To illustrate, consider the following example. Let the corner be defined as a rectangular region between the pads at (0,6), (3,6), (3,0), and (0,0). Note that some of the pads in this corner are signal pads (depicted by circles), while others are power or return pads (depicted by triangles) to which no signal line is connected. Consider the pads of the outer region, at coordinates (2,1), (2,3), (3,2), and (3,3). The signal lines that are connected to these pads of the outer region are routed out of the footprint in signal routing layer 1 (red).

Now, consider the pads of the outer region that are located at the coordinates (4,1), (4,2), (5,1), and (5,3). These are considered pads that are located between adjacent corners of the IC footprint, where, in the configuration of FIG. 10, the relevant corners are the one at (0,0) and the one at (37,0), the latter not being shown in FIG. 10 because it is located off the page. These latter pads are routed out of the IC footprint in signal routing layer 2 (blue).

For the example described above, it can be seen that by routing the signals that are connected to pads (2,1) and (2,3) in the signal routing layer 1 (red), rather than in signal routing layer 2 (blue), a path opens up in the signal routing layer 2 (blue) that allows the routing of a pair of angled signal lines labeled A, from the inner pad region. Similarly, routing signal lines from pads (3,2) and (3,3) in the signal routing layer 1 (red) creates room, on the signal routing layer 2 (blue), to route an additional pair of signal lines labeled B from the inner pad region. Applying the same technique to pads (1,5) and (3,5) makes room to route a pair of signal lines labeled F from the inner pad region on the routing layer 2 (blue). In fact, application of such a technique yields, in the example of FIG. 10, six pairs of signal lines that can be routed out of an inner pad region entirely on the routing layer 2 (blue). In addition, two pairs of signal lines labeled G and H can also be routed out of the inner pad region, however, these are routed on the routing layer 1 (red). Duplicating this technique at each corner of the IC footprint advantageously yields, for example, sufficient room for routing 56 signal lines to an inner pad region of a square IC footprint, without an additional routing layer being required, an advantageous effect.

In the embodiment of the invention illustrated in FIG. 10, signal lines that are connected to pads (0,0), (0,2), (0,3), (1,1), and (1,2), where these pads are located in an outermost part of the corner, are routed out of the footprint in the same signal routing layer (red) used to route out the signal lines that are connected to pads of the middle region such as pads (5,4), (5,6), (6,5), (6,6) etc. As an alternative, the signals connected to pads (0,0), (0,2), (0,3), (1,1), and (1,2) may be routed out of the footprint in the second routing layer (blue). This can be done without affecting the routing of the signal lines A–G that originate from the inner pad region.

Figure 11:
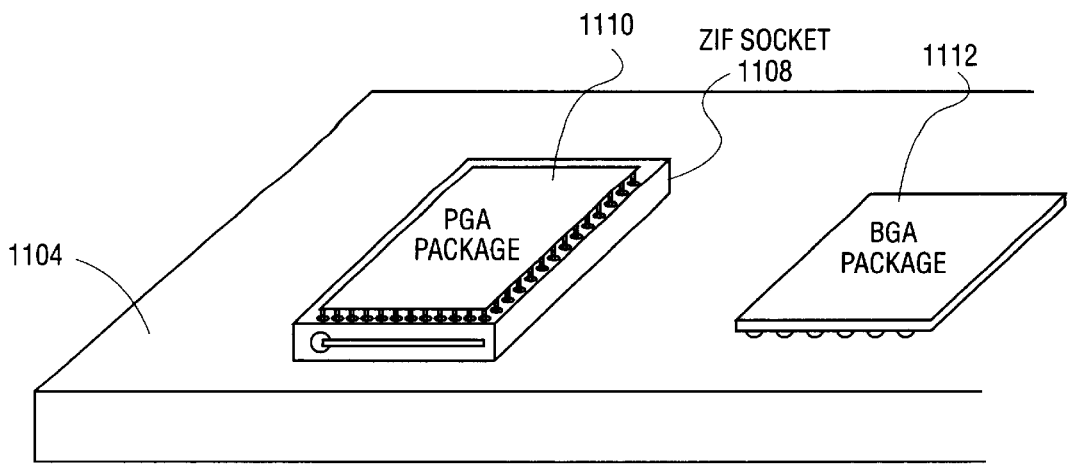
FIG. 11 depicts a printed wiring board with integrated circuit packages installed.

Referring now to FIG. 11, an application of the signal routing technique described is shown. This figure shows a printed wiring board 1104 on which a zero insertion force socket 1108 has been installed, by soldering the pins of the socket to corresponding pads (via through holes) of an IC footprint formed on a top side of the board 1104. A pin grid array integrated circuit package 1110 is installed in the socket 1108. The package 1110 may be of a cavity-down type that allows better cooling of the integrated circuit die (not shown) therein. The IC die may be, for example, a processor such as a PENTIUM brand processor by Intel Corporation of Santa Clara, Calif. The board 1104 also has a ball grid array package 1112 installed thereon. Some of the signal lines that are routed out of the footprint of the socket 1108 interconnect the processor with a system chipset of which a die is present in the ball grid array package 1112. In the embodiment of the invention in FIG. 11, the ball grid array package 1112 is also of a cavity-down type which is soldered to the pads of its corresponding IC footprint.

The embodiments of the invention described above are directed to a technique for routing signal lines out of a footprint, be it, for example, that of an integrated circuit package to be installed on a printed wiring board, or that of an integrated circuit die that is installed in a flip chip package. Signal lines that are connected to outer pads which are located in at least one corner of the footprint polygon are routed out of the footprint in a different signal routing layer than the one used to route the signal lines that are connected to outer pads that are located between two adjacent corners of the footprint. This is done in a way that creates sufficient space to route out of the footprint signal lines that are connected to inner pads of the footprint, in the same routing layer as that used to route the signal lines that are connected to the outer pads which are located between adjacent corners. The technique is particularly advantageous when there are an even number of signal routing layers, such that the technique may be applied to each pair of routing layers, to use the routing layers more efficiently. A modern application of the technique is to a footprint whose pads are sized to have an average spacing in a vertical or horizontal direction of 1.3 mm or less between adjacent pads, and where the signal lines are sized and arranged such that no more than two lines are routed between adjacent pads in the same routing layer.

Figure 12:
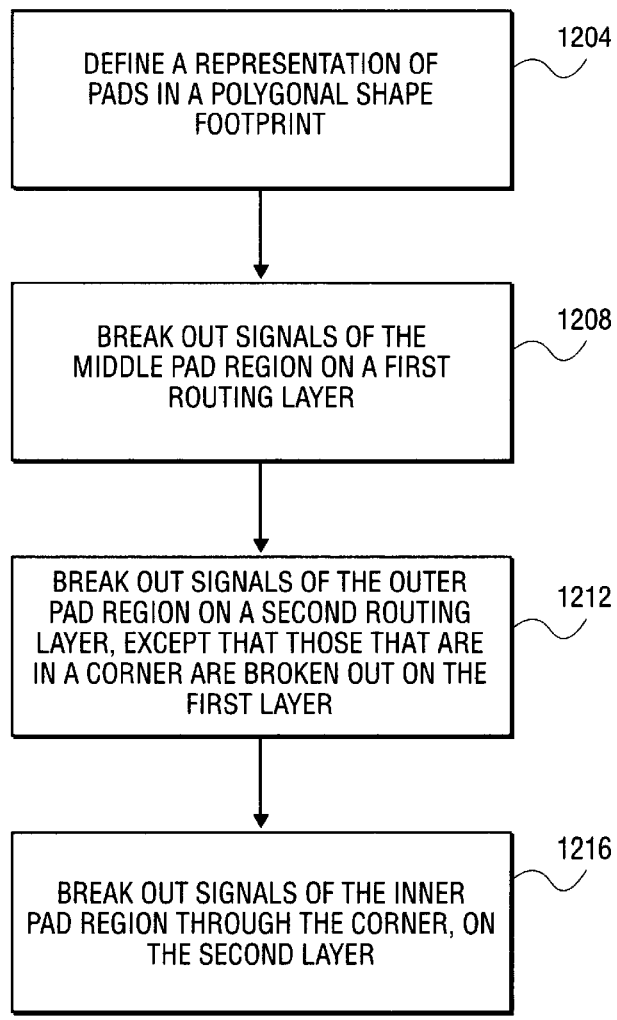
FIG. 12 depicts a flow diagram of a method for laying out a circuit.

Turning now to FIG. 12, a flow diagram of a method for laying out a circuit, according to an embodiment of the invention, is depicted. This method may be implemented using computer aided design software that is executing on a computer. Instructions that cause the computer to display a representation of a printed wiring board or an integrated circuit package, according to the various embodiments of the invention described above, may be stored on a machine readable medium such as an optical compact disc or a magnetic rotating disk drive. The method begins with the definition of a representation of a number of pads for an integrated circuit footprint having a polygonal shape, such as the square shape mentioned above (operation 204). The pads may be viewed as having an inner pad region, a middle pad region that surrounds the inner pad region, and an outer pad region that surrounds the middle pad region and that defines a perimeter of the polygonal shape.

A number of signals of the middle pad region are broken out of the footprint on a first routing layer, which may be indicated by the color red (operation 1208). In the embodiment of the invention depicted in FIG. 10, such signals may originate from the pads at locations (8,4), (8,6), (9,5), (9,6), etc. A number of signals of the outer pad region are broken out of the footprint on a second routing layer (indicated by the color blue), except that those that are in a corner of the polygonal shape are broken out on the first routing layer (operation 1212). This is designed to make room for breaking out a number of signals of the inner pad region on the second routing layer, such as shown in FIG. 10 for the pairs of signal lines A–F. The method proceeds in operation 1216 with breaking out the signals of the inner pad region (e.g., signal lines A–F as seen in FIG. 10) through the corner on the second routing layer (blue). The above described operations 1208–1216 may be repeated at each corner of the footprint, to break out as many signals as possible from the inner pad region without resorting to an additional routing layer.

To summarize, various embodiments of the invention, including a method for laying out a circuit on a printed wiring board or in an integrated circuit package, have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, the circuit layout technique described above may also be applied to IC footprints having more than three pad regions. As an example, the footprint may have eight regions arranged according to increasing area, similar to the three-region example shown in FIGS. 5 and 6. In that case, the technique could be applied to the group of regions 2,3, and 4 and/or to the group of regions 6, 7, and 8. Also, the minimum size of a pad array for which the technique may be cost-effective could be as small as 10×10, or smaller. In addition, the location of the IC footprint on a printed wiring board may be varied. For example, a rectangular IC footprint may be located at a corner of a printed wiring board such that the signals can be routed only through two sides of the footprint. In that case, the technique may prove to be even more beneficial in helping keep the number of signal routing layers from increasing. The specification and drawings are, accordingly, to be regarded in an illustrative rather than a restrictive sense.

What is claimed is:

1. An article of manufacture comprising:

an insulating layer between a plurality of signal routing layers; and a plurality of pads arranged as an integrated circuit footprint and formed in a stackup that includes the insulating layer and the plurality of signal layers, wherein the plurality of pads are arranged in a grid pattern and are sized to have an average spacing between adjacent pads of 1.3 mm or less, the footprint having a polygonal shape, an inner pad region, a middle pad region that surrounds the inner pad region, and an outer pad region that surrounds the middle pad region, some of the pads of each pad region being connected to a respective plurality of signal lines formed in the plurality of signal routing layers, and wherein some of the signal lines that are connected to pads of the outer region which are located in a corner of the polygonal shape are routed out of the footprint in a different one of the plurality of signal routing layers that is used to route the signal lines that are connected to pads of the outer region which are located between two adjacent corners of the polygonal shape so that there is sufficient space to route out of the inner pad region of the footprint a plurality of pairs of signal lines in the same routing layer, wherein each pair of signal lines passes between a respective pair of adjacent pads in the corner and the two signal lines of each pair run parallel to each other through the middle and outer pad regions.

2. The article of manufacture of claim 1 wherein the corner is a rectangular region that includes twenty eight pads and through which at least eight signal lines connected to eight pads, respectively, of the inner pad region, have been routed out of the footprint in the first routing layer.

3. The article of manufacture of claim 2 wherein some of the pads in the corner are signal pads to which a signal line is connected, and some others are power/return pads to which no signal line is connected.

4. The article of manufacture of claim 1 further comprising a metal layer in which the plurality of pads are formed, the metal layer being a part of the stackup that is separate from and lies above the plurality of signal routing layers.

5. The article of manufacture of claim 1 wherein some of the signal lines that are connected to pads of the outer region which are located in said corner of the polygonal shape are routed out of the footprint in the same signal routing layer used to route out the signal lines that are connected to pads of the middle region.

6. The article of manufacture of claim 1 wherein the signal lines that are connected to pads of the inner region are routed out of the footprint in the same signal routing layer used to route out the signal lines that are connected to pads of the outer region which are located between two adjacent corners of the polygonal shape.

7. The article of manufacture of claim 1 wherein there is an even number of the plurality of signal routing layers.

8. The article of manufacture of claim 7 wherein the stackup is in a printed wiring board and further comprises a plurality of reference planes that include a power supply plane and a power return plane.

9. The article of manufacture of claim 7 in combination with an integrated circuit package of a cavity-down type which is installed on the board to electrically connect to the plurality of pads, wherein the integrated circuit package is that of a processor.

10. The article of manufacture of claim 9 wherein said some of the pads of each region that are connected to the respective plurality of signal lines interconnect the processor package with a system chipset integrated circuit package that is installed on the board.

11. The article of manufacture of claim 1 wherein the signal lines are sized and arranged such that no more than two signal lines in the same routing layer are routed between adjacent pads.

12. The article of manufacture of claim 1 wherein the footprint is designed to allow a ball grid array integrated circuit package to be soldered to the plurality of pads.

13. The article of manufacture of claim 12 in combination with a ball grid array integrated circuit package of a cavity-down type which is soldered to the plurality of pads.

14. The article of manufacture of claim 1 wherein the footprint is designed to allow a socket for a pin grid array integrated circuit package to be soldered to the plurality of pads.

15. The article of manufacture of claim 14 in combination with a socket that is soldered to the plurality of pads, and a pin grid array integrated circuit package installed in the socket.

16. The article of manufacture of claim 1 wherein the plurality of pads number at least as many as in a 37×37 array.

17. The article of manufacture of claim 1 wherein the footprint is designed to allow an integrated circuit die to be soldered to the plurality of pads.

18. The article of manufacture of claim 17 in combination with an integrated circuit die which is soldered to the plurality of pads in a flip chip integrated circuit package.

19. A system comprising:
a printed wiring board having a plurality of signal routing layers, and a plurality of pads arranged as an integrated circuit package footprint that has a rectangular shape, wherein the plurality of pads are arranged in a grid pattern and are sized to have an average spacing between adjacent pads of 1.3 mm or less, the footprint having an inner pad region, a middle pad region that surrounds the inner pad region, and an outer pad region that surrounds the middle pad region, some of the pads of each region being connected to a respective plurality of signal lines formed in the plurality of signal routing layers, and wherein some of the signal lines that are connected to outer pads which are located in two corners of the rectangle are routed out of the footprint in a different one of the plurality of signal routing layers that is used to route the signal lines that are connected to outer pads which are located between the two corners, so that there is sufficient space to route out of the footprint some of the signal lines that are connected to inner pads, in the same signal routing layer used to route out the signal lines that are connected to outer pads which are located between adjacent corners, wherein a plurality of pairs of signal lines are routed out of the inner pad region in the same routing layer, wherein each pair of signal lines passes between a respective pair of adjacent pads in the corner and the two signal lines of each pair run parallel to each other through the middle and outer pad regions; and an integrated circuit package which is installed on the board to electrically connect to the plurality of pads.

20. The system of claim 19 wherein some of the pads in each corner are signal pads to which a signal line is connected, and some others are power/return pads to which no signal line is connected.

21. The system of claim 19 wherein there is an even number of the plurality of signal routing layers.

22. The system of claim 21 wherein the signal lines are sized and arranged such that no more than two signal lines in the same routing layer are routed between adjacent pads.

23. The system of claim 21 wherein the plurality of pads number at least as many as in a 37×37 array.

24. The system of claim 19 wherein the integrated circuit package is of a cavity-down type.

25. The system of claim 24 wherein the integrated circuit package is that of a processor.

26. A method for laying out a circuit, comprising:
a) defining a representation of a plurality of pads for an integrated circuit footprint having a polygonal shape, an inner pad region, a middle pad region that surrounds the inner pad region, and an outer pad region that surrounds the middle pad region and that defines a perimeter of the polygonal shape, wherein the plurality of pads are arranged in a grid pattern and are sized to have an average spacing between adjacent pads of 1.3 mm or less;
b) breaking out a plurality of signals of the middle pad region only on a first routing layer; and
c) breaking out a plurality of signals of the outer pad region only on a second routing layer, except that those that are in a corner of the polygonal shape are broken out on only the first routing layer to make room for breaking out a plurality of pairs signals of the inner pad region on only the second routing layer through the corner; and
d) breaking out the plurality of pairs of signals of the inner pad region on only the second routing layer, through the corner, wherein each pair of signal lines passes between a respective pair of adjacent pads in the corner and the two signal lines of each pair run parallel to each other through the middle and outer pad regions.

27. The method of claim 26 wherein the corner is a rectangular region of sixteen pads and through which at least four signals of the inner pad region have been broken out.

28. The method of claim 26 wherein in d), all of said plurality of signals of the inner pad region are broken out without overlapping any of those broken out of the outer pad region, outside the corner, in c).

29. The method of claim 26 wherein the polygonal shape is a square.

30. The method of claim 26 wherein the representation is of a plurality of pads arranged in a grid pattern with an average spacing between adjacent pads of 1.3 mm or less.

31. The method of claim 26 wherein the representation is of signal lines that are arranged and sized such that no more than two signals in the same routing layer can be broken out between adjacent pads.

32. The method of claim 26 wherein the representation is of a plurality of pads that number at least as many as in a 37×37 array.

33. An article of manufacture comprising:
a machine readable medium having instructions stored thereon which, when executed by a processor, cause an electronic system to display a representation of an article of manufacture in which there is an insulating layer between a plurality of signal routing layers, and a plurality of pads arranged as an integrated circuit footprint and formed in a stackup that includes the insulating layer and the plurality of signal layers, wherein the plurality of pads are arranged in a grid pattern and are sized to have an average spacing between adjacent pads of 1.3 mm or less, the footprint having a polygonal shape, an inner pad region, a middle pad region that surrounds the inner pad region, and an outer pad region that surrounds the middle pad region, some of the pads of each pad region being connected to a respective plurality of signal lines formed in the plurality of signal routing layers, and wherein some of the signal lines that are connected to pads of the outer region which are located in a corner of the polygonal shape are routed out of the footprint in a different one of the plurality of signal routing layers that is used to route the signal lines that are connected to pads of the outer region which are located between two adjacent corners of the polygonal shape so that there is sufficient space to route out of the inner pad region of the footprint a plurality of pairs of signal lines in the same routing layer, wherein each pair of signal lines passes between a respective pair of adjacent pads in the corner and the two signal lines of each pair run parallel to each other through the middle and outer pad regions.

34. The article of manufacture of claim 33 wherein the machine readable medium includes further instructions that when executed cause the system to display a representation of at least four signal lines, connected to four pads, respectively, of the inner pad region, that are routed out of the footprint in the first routing layer through the corner being a region having at least sixteen pads.

35. The article of manufacture of claim 34 wherein the instructions are to represent some of the pads in the corner as being signal pads to which a signal line is connected, and some others as being power/return pads to which no signal line is connected.

36. The article of manufacture of claim 35 wherein the instructions are to represent the article of manufacture as a printed wiring board.

37. The article of manufacture of claim 35 wherein the machine readable medium includes further instructions that when executed cause the system to display a representation of a plurality of signal lines, connected to pads of the inner pad region, as being routed out of the footprint on the same routing layer as the one in which said signal lines of the outer region are routed out.

* * * * *